United States Patent
Johannesson

(10) Patent No.: US 9,316,671 B2
(45) Date of Patent: Apr. 19, 2016

(54) METHOD FOR SENSING A FAULT IN A POWER SYSTEM BASED ON TRAVELLING WAVE CURRENTS

(71) Applicant: ABB TECHNOLOGY LTD, Zürich (CH)

(72) Inventor: Niclas Johannesson, Ludvika (SE)

(73) Assignee: ABB TECHNOLOGY LTD, Zürich (CH)

( * ) Notice: Subject to any disclaimer, the term of this patent is extended or adjusted under 35 U.S.C. 154(b) by 0 days.

(21) Appl. No.: 14/433,204

(22) PCT Filed: Oct. 3, 2012

(86) PCT No.: PCT/EP2012/069536
§ 371 (c)(1),
(2) Date: Apr. 2, 2015

(87) PCT Pub. No.: WO2014/053174
PCT Pub. Date: Apr. 10, 2014

(65) Prior Publication Data
US 2015/0233976 A1    Aug. 20, 2015

(51) Int. Cl.
*G01R 15/18* (2006.01)
*G01R 31/40* (2014.01)

(52) U.S. Cl.
CPC ............... *G01R 15/18* (2013.01); *G01R 31/40* (2013.01)

(58) Field of Classification Search
CPC .... G01R 31/40; G01R 15/18; G01R 19/2513; H02H 3/044
See application file for complete search history.

(56) References Cited

U.S. PATENT DOCUMENTS 3,590,368 A    6/1971  Esclangon
4,183,072 A    1/1980  Takagi et al.

(Continued)

OTHER PUBLICATIONS

Bollen, "On Travelling-Wave-Based Protection of High-Voltage Networks", Sep. 15, 1989, 137 pages.

*Primary Examiner* — Huy Q Phan
*Assistant Examiner* — Dustin Dickinson
(74) *Attorney, Agent, or Firm* — Birch, Stewart, Kolasch & Birch, LLP

(57) ABSTRACT

A fault sensing system for a power system including a protected unit is disclosed. The fault sensing system is adapted to sense a fault in the protected unit. The fault sensing system includes at least one current sensing unit adapted to sense at least one first current in a first position in the protected unit and at least one second current in the second position in the protected unit and at least one voltage sensing unit adapted to sense at least one first voltage in the first position and at least one second voltage in the second position, and at least one processing unit. The at least one processing unit is adapted to model any distortion, attenuation and/or delay of the waveform of a wave due to propagation of the wave in the protected unit by means of a propagation function, determine at least one first travelling wave current in the first position based on the at least one first current and the at least one first voltage, determine at least one second travelling wave current in the second position based on the at least one second current and the at least one second voltage, estimate at least one of the at least one first travelling wave current and the at least one second travelling wave current by applying the propagation function to the at least one second travelling wave current or to the at least one first travelling wave current, respectively, on a condition that the at least one first travelling wave current is estimated, compare the estimated at least one first travelling wave current with the determined at least one first travelling wave current, on a condition that the at least one second travelling wave current is estimated, compare the estimated at least one second travelling wave current with the determined at least one second travelling wave current, and, based on the comparison or comparisons, determine whether there is a fault in the protected unit.

18 Claims, 7 Drawing Sheets

(56) References Cited

U.S. PATENT DOCUMENTS

| | | |
|---|---|---|
| 4,352,137 A | 9/1982 | Johns |
| 4,438,475 A | 3/1984 | Haley |
| 5,319,311 A * | 6/1994 | Kawashima ........... G01R 31/11 324/533 |
| 5,576,625 A | 11/1996 | Sukegawa et al. |
| 2007/0059986 A1 | 3/2007 | Rockwell |
| 2011/0178741 A1 * | 7/2011 | Saha ................. G01R 31/085 702/59 |
| 2012/0065907 A1 * | 3/2012 | Kozakai ............. G01R 19/2513 702/57 |

* cited by examiner

METHOD FOR SENSING A FAULT IN A POWER SYSTEM BASED ON TRAVELLING WAVE CURRENTS

TECHNICAL FIELD

The present invention generally relates to power systems such as electrical power distribution or transmission systems, e.g. High Voltage Direct Current (HVDC) power transmission systems. Specifically, the present invention relates to a method for sensing a fault in a protected unit included in a power system.

BACKGROUND

Power systems such as electrical power distribution or transmission systems generally include a protection system for protecting, monitoring and controlling the operation and/or functionality of other components included in the power system. Such a protection system may for example detect short-circuits, over-currents and over-voltages in power lines, transformers and/or other parts or components of the power system. The protection system can include protection equipment such as circuit breakers for isolating any possible faults for example occurring in power transmission and distribution lines by opening or tripping the circuit breakers. After the fault has been cleared, e.g. by performing repairs and/or maintenance on the component in which the fault has been detected, the power flow can be restored by closing the circuit breakers. Alternatively or optionally, the protection system can be arranged to, upon detection of a fault in a particular route for power flow, isolate the route in which the fault has been detected and select an alternative route for the power flow.

Differential protection is a method for protection of power systems that is based on comparing currents on sides of a protected zone or a protected unit. A protected unit could in principle include or be any part or component of the power system, for example a transmission line, transformer, generator, and/or a transformer station busbar. Differential protection is a widely used type of protection in power systems due to advantages such as speed, reliability, sensitivity and selectivity. The differential protection principle is based on Kirchhoff's current law, and is usually implemented by summation of all the measured currents entering and leaving the protected unit and detecting a fault if the sum deviates from zero, hence indicating that some abnormal current path exist, i.e. a fault, in the protected unit. However, since 'regular' circuit theory no longer holds when the propagation time in a circuit is not negligible, performance of the differential protection may be degraded in such cases. For example, when the differential protection is applied in protected units where the power flow or current path is relatively long, e.g. where the protected unit is a relatively long transmission line such as an overhead transmission line (OHL) or a direct current (DC) cable, fault detection reliability and/or accuracy may be degraded due to time of propagation and reflections of travelling waves in the protected unit. By a "relatively long" current path or transmission line it is generally meant a current path or transmission line that cannot be accurately represented by a 'lumped' transmission line model or lumped element model, i.e. a current path or transmission line for which the transmission line parameters or attributes such as impedance, speed of wave propagation and bandwidth of the waveform of a wave are distributed throughout the material of the current path or transmission line. This is generally the case where the current path or transmission line has a length that is relatively large compared to the wavelength or a fraction of the wavelength of the operating frequency of the current path or transmission line. In non steady state, time of propagation and reflections of travelling waves in the protected unit can cause the currents in the line ends to differ, in particular during transients caused by e.g. external faults, and thereby give rise to a detection of a fault in the protected unit even though there is no fault at the time. In turn, this can cause an increase in unwarranted trips of circuit breakers in the power system, thereby causing an unwarranted interruption in power flow.

U.S. Pat. No. 4,183,072 discloses a protective relaying system including a protected AC transmission line and detection means for detecting a change in propagation mode of a traveling wave propagating along the transmission line. The transmission line has a pair of line ends and a surge propagation time $\tau$, and the detection means is effective for comparing a value of the traveling wave as it passes one of the line ends at a time t-$\tau$ and a value of the traveling wave as it passes the other of the line ends at a time t after the surge propagation time has elapsed for detecting a change in wave value resulting from a change in wave propagation mode.

SUMMARY

For OHL configurations, distortion of the waveform of travelling waves is generally small and may be neglected. However, for other configurations such as DC cables or OHL-DC cable mixed configurations, distortion and/or attenuation of the waveform of travelling waves is generally not negligible.

In view of the above discussion, a concern of the present invention is to provide a method for sensing a fault in a protected unit included in a power system, which protected unit is adapted to, under normal or non-faulted operation conditions, convey power from a first position in the protected unit to a second position, different from the first position, in the protected unit, or vice versa, wherein on a condition that a fault occurs in the protected unit at least one travelling wave is generated in the protected unit, which method provides an increased fault sensing reliability and/or accuracy compared to known differential protection methods particularly in case the protected unit, e.g. a transmission line, is such that waveform distortion and/or attenuation of travelling waves in the protected unit is not negligible.

Any distortion of the waveform of a wave due to the propagation of the wave in the protected unit is generally due to the wave impedance being frequency dependent. Any attenuation of a wave due to the propagation of the wave in the protected unit is generally due to due to loss of energy, e.g. in the resistances of the protected unit conductors and earth. Any delay of a wave due to the propagation of the wave in the protected unit is generally due to the wave impedance being frequency dependent and/or the length of the power flow or current path in the protected unit.

A further concern of the present invention is to provide a method for sensing a fault in a protected unit included in a power system, which protected unit is adapted to, under normal or non-faulted operation conditions, convey power from a first position in the protected unit to a second position, different from the first position, in the protected unit, or vice versa, wherein on a condition that a fault occurs in the protected unit at least one travelling wave is generated in the protected unit, which method facilitates or enables reducing or even eliminating the number of unwarranted interruption in power flow in the power system, e.g. by tripping of circuit breakers in the power system, due to false detections of faults in the protected unit.

To address at least one of these concerns and other concerns, a method, a fault sensing system, a power system and a computer program product in accordance with the independent claims are provided. Preferred embodiments are defined by the dependent claims.

In the following, the protected unit will often be referred to by the example of it being constituted by a transmission line. However, it is to be understood that the protected unit in general may include or be any part or component of the power system, for example a transmission line, a transformer, a generator and/or a transformer station busbar.

Attenuation and distortion of waves due to their propagation along a current path in the protected unit or in the transmission line result in a decrease in amplitude and elongation of the waves. The attenuation is generally due to loss of energy, e.g. in the resistances of the protected unit conductors and earth. The distortion is generally due to the wave impedance being frequency dependent.

In the event of a fault occurring in a transmission line, transients that propagate along the transmission line as waves are created. Each wave may be a composite of frequencies, ranging from a few kHz to several MHz, having a fast rising front and a slower decaying tail. Composite waves may travel at a fraction or close to the speed of light in vacuum away from the fault location toward line ends. For example in DC cables, waves may travel at speeds of about one fourth to one third of the speed of light in vacuum. The waves continue to travel throughout the power system until an equilibrium state is reached.

According to a first aspect of the present invention, there is provided a method for sensing a fault in a protected unit included in a power system. The protected unit is adapted to convey power from a first position in the protected unit to a second position, different from the first position, in the protected unit, or vice versa. On a condition that a fault occurs in the protected unit at least one travelling wave is generated in the protected unit, wherein any distortion, attenuation and/or delay of the waveform of a wave due to propagation of the wave in the protected unit can be modeled by means of a propagation function. The method comprises sensing at least one first current and at least one first voltage, respectively, in the first position. At least one second current and at least one second voltage, respectively, in the second position, are sensed. At least one first travelling wave current in the first position is determined based on the at least one first current and the at least one first voltage. At least one second travelling wave current in the second position is determined based on the at least one second current and the at least one second voltage. At least one of the at least one first travelling wave current and the at least one second travelling wave current is estimated by applying the propagation function to the at least one second travelling wave current or to the at least one first travelling wave current, respectively. On a condition that the at least one first travelling wave current is estimated, the estimated at least one first travelling wave current is compared with the determined at least one first travelling wave current. On a condition that the at least one second travelling wave current is estimated, the estimated at least one second travelling wave current is compared with the determined at least one second travelling wave current. Based on the comparison or comparisons, there is determined whether there is a fault in the protected unit.

According to the present invention, at least one first travelling wave current and at least one second travelling wave current, $I_{TW}$, are determined, the at least one first travelling wave current $I_{TW}$ representing a first line end or position on the transmission line, and the at least one second travelling wave current $I_{TW}$ representing a second line end or position on the transmission line. According to the present invention, $I_{TW}$ for one of the line ends is estimated based on $I_{TW}$ for the other one of the line ends and the propagation function, which takes into account and/or introduces the effect of any distortion, attenuation and/or delay of the waveform of a wave due to propagation of the wave in the protected unit or transmission line.

According to an embodiment of the present invention, a travelling wave differential current for one of the line ends can be defined as the difference between $I_{TW}$ for the respective line ends after the propagation function has been applied to $I_{TW}$ for the other line end.

Hence, the measured or sensed voltage and current in one line end can be used to construct $I_{TW}$ for one line end, which in turn can be used in estimating $I_{TW}$ for the other line end by applying the propagation function. The estimated $I_{TW}$ can then be compared with the $I_{TW}$ for the same line end that has been constructed using the measured or sensed voltage and current in that line end. If the two differ according to some predefined criteria, an abnormal or unexpected current path may exist in the transmission line, which implies that there is a fault in the transmission line.

By utilizing the propagation function in the estimating of $I_{TW}$, any non-negligible distortion, attenuation and/or delay of the waveform of a wave due to the propagation of the wave in the protected unit or transmission line may be accounted for. Thereby, a relatively high fault sensing reliability and/or accuracy may be achieved, not only for protected unit configurations such as OHL where distortion of the waveform of travelling waves generally is small and can be neglected, but also for other configurations such as DC cables where distortion of the waveform of travelling waves is not negligible.

As will be further described in the following, the propagation function may for example be determined or estimated by means of time-domain simulation techniques that provide a relatively accurate representation of the frequency dependent propagation function. Such time-domain simulation techniques may be based on or be constituted by for example PSCAD®, also known as PSCAD®/EMTDC™, developed by Manitoba HVDC Research Centre, 211 Commerce Drive, Winnipeg, Manitoba, R3P 1A3, Canada.

The determination of the at least one first travelling wave current and/or the at least one second travelling wave current may be based on an estimated surge admittance of the protected unit.

As will be further described in the following, the surge admittance may for example be determined or estimated by means of time-domain simulation techniques that provide a relatively accurate representation of the frequency dependent surge admittance. Such time-domain simulation techniques may be based on or be constituted by for example PSCAD®.

The sensing of the at least one second current and the at least one second voltage, respectively, in the second position may be performed subsequent to sensing the at least one first current and the at least one first voltage, respectively, in the first position, or vice versa.

The sensing of the at least one first current and the sensing of the at least one first voltage may be performed substantially simultaneously.

Alternatively or optionally, the sensing of the at least one second current and the sensing of the at least one second voltage may be performed substantially simultaneously.

On a condition that the at least one first travelling wave current is estimated, a time when the respective current or voltage was sensed may be determined or measured, for each of the at least one first current and the at least one first voltage. Time information associated with the at least one first travelling wave current may be determined based on the time when the at least one first current and/or the at least one first voltage was sensed.

On a condition that the at least one second travelling wave current is estimated, a time when the respective current or voltage was sensed may be determined or measured, for each of the at least one second current and the at least one second voltage. Time information associated with the at least one second travelling wave current may be determined based on the time when the at least one second current and/or the at least one second voltage was sensed.

A time-shift function based on at least the determined time information and a propagation time period of a wave travelling from the first position to the second position, or vice versa, may be determined.

Prior to estimating at least one of the at least one first travelling wave current and the at least one second travelling wave current, the time-shift function may be applied to the propagation function so as to modify the propagation function. Thereby, the propagation function which is used in estimating at least one of the at least one first travelling wave current and the at least one second travelling wave current is a modified one, modified by application of the time-shift function to the 'original' propagation function. Application of such a time-shift function is described in more detail below with reference to FIGS. 3-6.

The protected unit may be adapted to convey power from a first position in the protected unit to a second position in the protected unit, or vice versa, along at least one current path between the first position and the second position.

The surge admittance may be estimated based on at least one of the line series impedance per unit length of the at least one current path and the line shunt admittance per unit length of the at least one current path. Alternatively or optionally, the propagation function may be based on at least one of the line series impedance per unit length of the at least one current path, the line shunt admittance per unit length of the at least one current path and a length of the at least one current path.

Comparison of the estimated at least one first travelling wave current with the determined at least one first travelling wave current may comprise determining a difference between the estimated at least one first travelling wave current and the determined at least one first travelling wave current. Comparison of the estimated at least one second travelling wave current with the determined at least one second travelling wave current may comprise determining a difference between the estimated at least one second travelling wave current and the determined at least one second travelling wave current.

Determining whether there is a fault in the protected unit may comprise determining that there is a fault in the protected unit on a condition that an absolute value of the difference or differences exceeds a predefined threshold value and determining that there is no fault in the protected unit on a condition that the absolute value of the difference or differences does not exceed the predefined threshold value.

Determining whether there is a fault in the protected unit may in general include determining a fault detection characteristic based on the estimated at least one second travelling wave current and the determined at least one second travelling wave current, and/or the difference between the estimated at least one second travelling wave current and the determined at least one second travelling wave current, and comparing the fault detection characteristic with a selected fault detection criteria, which may be predefined. On a condition that the fault detection characteristic complies or substantially complies with the selected fault detection criteria, there may be determined that there is a fault in the protected unit. On a condition that the fault detection characteristic does not comply with the selected fault detection criteria, there may be determined that there is no fault in the protected unit. For example, the fault detection characteristic may include or be constituted by a time-inverse characteristic, which may permit faster actuation of fault protection equipment, e.g. tripping of circuit breakers, in case of low impedance faults in contrast to high impedance faults where a comparatively small differential current might be allowed to flow for some period of time. Hence, the larger the fault current the faster the actuation of the fault protection equipment may become. According to another example, the fault detection characteristic may include or be constituted by a so called current restraining characteristic, where in assessment of whether there is a fault in the protected unit an overcurrent sustained during a certain time period is used as an indication of presence of a fault in the protected unit.

The protected unit may for example comprise a DC transmission line, such as a HVDC transmission line, or several DC or HVDC transmission lines e.g. arranged in a grid. The power system may comprise a HVDC power transmission system. HVDC transmission lines may be arranged in configurations such as monopole, symmetric monopole, or bipolar configurations. For example, a bipolar HVDC transmission line comprises a positive pole line, a negative pole line, and a metallic return line connected to ground. Faults that may occur on a bipolar HVDC transmission line include positive pole to negative pole short circuits, positive pole to ground short circuits, and negative pole to ground short circuits. Embodiments of the present invention may for example be implemented in the positive pole line and/or the negative pole line of a bipolar HVDC transmission line, or in other transmission line configurations that can be envisaged by the person skilled in the art. In other words, the protected unit may be included in the positive pole line and/or the negative pole line of a bipolar HVDC transmission line, or in another transmission line configuration.

According to embodiments of the present invention, the power system is an Alternating Current (AC) based power system, a DC based power system, or possibly a power system based on a combination of AC and DC components or constituents. Principles of embodiments of the present invention are applicable in an AC based power system or a DC based power system in the same or substantially the same way, since embodiments of the present invention are based on equations for e.g. voltage and current in a transmission line and are insensitive to if the voltage source is an AC voltage source or a DC voltage source. This will become further evident in the following description, in particular in the following description with reference to the equations below, particularly equations 2.1-2.7, 3.1-3.14, 5.1, 5.2, and 7.11-7.16. According to a second aspect of the present invention, there is provided a fault sensing system for a power system including a protected unit. The fault sensing system is adapted to sense a fault in the protected unit. The protected unit is adapted to convey power from a first position in the protected unit to a second position, different from the first position, in the protected unit, or vice versa. On a condition that a fault occurs in the protected unit at least one travelling wave is generated in the protected unit. The fault sensing system comprises at least one current sensing unit adapted to sense at least one first current in the first position and at least one second current in the second position, at least one voltage sensing unit adapted to sense at least one first voltage in the first position and at least one second voltage in the second position, and a processing unit.

The processing unit is adapted to model any distortion, attenuation and/or delay of the waveform of a wave due to propagation of the wave in the protected unit by means of a propagation function.

The processing unit is adapted to determine at least one first travelling wave current in the first position based on the at least one first current and the at least one first voltage, and determine at least one second travelling wave current in the second position based on the at least one second current and the at least one second voltage. The determination of the at least one first travelling wave current and/or the at least one second travelling wave current may be based on an estimated surge admittance of the protected unit.

The processing unit is adapted to estimate at least one of the at least one first travelling wave current and the at least one second travelling wave current by applying the propagation function to the at least one second travelling wave current or to the at least one first travelling wave current, respectively.

The processing unit is adapted to, on a condition that the at least one first travelling wave current is estimated, compare the estimated at least one first travelling wave current with the determined at least one first travelling wave current, and/or, on a condition that the at least one second travelling wave current is estimated, compare the estimated at least one second travelling wave current with the determined at least one second travelling wave current.

The processing unit is adapted to, based on the comparison or comparisons, determine whether there is a fault in the protected unit.

On a condition that the at least one first travelling wave current is estimated, the processing unit may be adapted to determine or measure a time when the respective current or voltage was sensed, for each of the at least one first current and the at least one first voltage. Time information associated with the at least one first travelling wave current may be determined based on the time when the at least one first current and/or the at least one first voltage was sensed. To this end, according to one example, the fault sensing system, e.g. the processing unit, may include a memory unit for storing data, e.g. the determined or measured time when the respective currents or voltages were sensed, and a clock unit for measuring or keeping track of time. Alternatively or optionally, the power system may comprise a memory unit and a clock unit.

On a condition that the at least one second travelling wave current is estimated, the processing unit may be adapted to determine or measure a time when the respective current or voltage was sensed, for each of the at least one second current and the at least one second voltage. Time information associated with the at least one second travelling wave current may be determined based on the time when the at least one second current and/or the at least one second voltage was sensed.

The processing unit may be adapted to determine a time-shift function based on at least the determined time information and a propagation time period of a wave travelling from the first position to the second position, or vice versa, may be determined. The processing unit may be adapted to, prior to estimating at least one of the at least one first travelling wave current and the at least one second travelling wave current, apply the time-shift function to the propagation function so as to modify the propagation function. Thereby, the propagation function which is used in estimating at least one of the at least one first travelling wave current and the at least one second travelling wave current is a modified one, modified by application of the time-shift function to the 'original' propagation function.

In alternative or in addition, the time-shift function may be determined based on transmitting a signal from the first position to the second position, or vice versa, and upon receipt of the signal at the second position or first position, respectively, transmit a signal from the second position or the first position, respectively, back to the first position to the second position, respectively. The time-shift function may be determined based on the travelling times of the signals back and forth between the first and second positions and possibly also a 'turn-around' time between receipt of the signal at the first position or second position and transmission of a signal therefrom to the second position or first position, respectively.

The processing unit may include or be constituted by any suitable central processing unit (CPU), microcontroller, digital signal processor (DSP), Application Specific Integrated Circuit (ASIC), Field Programmable Gate Array (FPGA), etc., or any combination thereof. The processing unit may optionally be capable of executing software instructions stored in a computer program product e.g. in the form of a memory. The memory may for example be any combination of read and write memory (RAM) and read only memory (ROM). The memory may comprise persistent storage, which for example can be a magnetic memory, an optical memory, a solid state memory or a remotely mounted memory, or any combination thereof.

According to a third aspect of the present invention, there is provided a method for protecting a protected unit included in a power system. The protected unit is adapted to convey power from a first position in the protected unit to a second position, different from the first position, in the protected unit, or vice versa. The method comprises sensing a fault in the protected unit by performing a method according to the first aspect of the present invention. On a condition that there is determined that there is a fault in the protected unit, the protected unit is isolated from at least a portion of the rest of the power system.

Isolating the protected unit from at least a portion of the rest of the power system may be performed in different ways. According to one example, the power system may comprise at least one circuit breaker arranged at a first end of the protected unit and at least one circuit breaker arranged at a second end of the protected unit, wherein the first position is arranged at the first end and the second position is arranged at the second end. Isolating the protected unit from at least a portion of the rest of the power system may comprise opening the at least one circuit breaker at the first and second ends, respectively.

According to a fourth aspect of the present invention, there is provided a power system including a protected unit adapted to convey power from a first position in the protected unit to a second position, different from the first position, in the protected unit, or vice versa, and a fault sensing system according to the second aspect of the present invention for sensing whether there is a fault in the protected unit.

According to a fifth aspect of the present invention, there is provided a computer program product adapted to be executed in a processing unit of a fault sensing system in a power system. The computer program product comprises computer-readable means carrying computer program code. The power system comprises a protected unit, wherein the fault sensing system is adapted to sense a fault in the protected unit. The protected unit is adapted to convey power from a first position in the protected unit to a second position, different from the first position, in the protected unit, or vice versa. The fault sensing system comprises at least one current sensing unit and at least one voltage sensing unit. On a condition that a fault occurs in the protected unit at least one travelling wave is generated in the protected unit, wherein the processing unit is adapted to model any distortion, attenuation and/or delay of the waveform of a wave due to propagation of the wave in the protected unit by means of a propagation function. The computer program code is configured to, when executed in the processing unit of the fault sensing system, cause the at least one current sensing unit to sense at least one first current in the first position and at least one second current in the second position, and cause the at least one voltage sensing unit to sense at least one first voltage in the first position and at least one second voltage in the second position. The computer program code is configured to, when executed in the processing unit of the fault sensing system, determine at least one first travelling wave current in the first position based on the at least one first current and the at least one first voltage, and determine at least one second travelling wave current in the second position based on the at least one second current and the at least one second voltage. The computer program code is configured to, when executed in the processing unit of the fault sensing system, estimate at least one of the at least one first travelling wave current and the at least one second travelling wave current by applying the propagation function to the at least one second travelling wave current or to the at least one first travelling wave current, respectively. The computer program code is configured to, when executed in the processing unit of the fault sensing system, on a condition that the at least one first travelling wave current is estimated, compare the estimated at least one first travelling wave current with the determined at least one first travelling wave current, on a condition that the at least one second travelling wave current is estimated, compare the estimated at least one second travelling wave current with the determined at least one second travelling wave current. The computer program code is configured to, when executed in the processing unit of the fault sensing system, based on the comparison or comparisons, determine whether there is a fault in the protected unit.

The processing unit of the fault sensing system may include or be constituted by any suitable CPU, microcontroller, DSP, ASIC, FPGA, etc., or any combination thereof.

The computer-readable means of the computer program product may include a memory or any combination of RAM and ROM. The memory may comprise persistent storage, which for example can be a magnetic memory, an optical memory, a solid state memory or a remotely mounted memory, or any combination thereof.

Further objects and advantages of the present invention are described in the following by means of exemplifying embodiments.

It is noted that the present invention relates to all possible combinations of features recited in the claims. Further features of, and advantages with, the present invention will become apparent when studying the appended claims and the following description. Those skilled in the art realize that different features of the present invention can be combined to create embodiments other than those described in the following.

BRIEF DESCRIPTION OF THE DRAWINGS

Exemplifying embodiments of the invention will be described below with reference to the other accompanying drawings, in which.

In the accompanying drawings, the same reference numerals denote the same or similar elements throughout the views.

DETAILED DESCRIPTION

The present invention will now be described more fully hereinafter with reference to the accompanying drawings, in which exemplifying embodiments of the present invention are shown. The present invention may, however, be embodied in many different forms and should not be construed as limited to the embodiments set forth herein; rather, these embodiments are provided by way of example so that this disclosure will convey the scope of the invention to those skilled in the art. Furthermore, like numbers refer to like or similar elements or components throughout. The steps of any method described herein do not have to be performed in the exact order as described, unless specifically stated.

Figure 1:
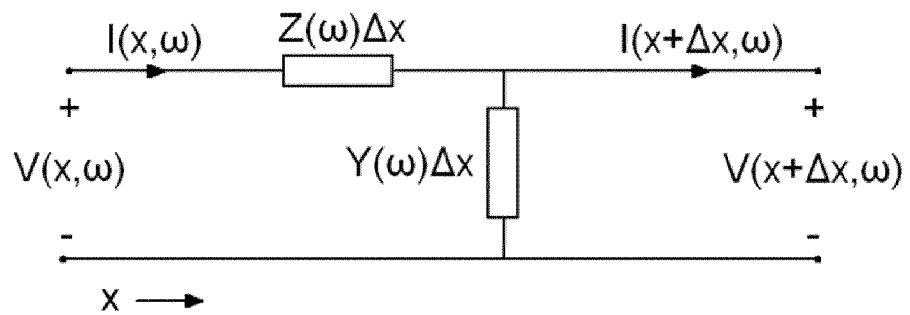
FIG. 1 is a schematic view of a section of a single-phase two-wire transmission line for illustrating principles and underlying theory of the present invention.

In a transmission line where the travel time between line ends cannot be neglected, the distributed impedance of the line must be accounted for. FIG. 1 shows an example of a single-phase two-wire transmission line having a length $\Delta x$ for illustrating principles and underlying theory of the present invention. Using the notations of the transmission line section of length $\Delta x$ in FIG. 1, where $Z(\omega)$ and $Y(\omega)$ are the per-unit length series impedance and shunt admittance respectively, and x is a coordinate along the transmission line section and $\omega$ is a frequency, a set of differential equations relating voltage and current can be derived, also known as telegrapher's equations. The solution to these differential equations expressed in voltage and current can be written in the frequency domain as shown in equations (2.1) and (2.2):

$$I(x, \omega) = I^+(\omega)e^{-\gamma(\omega)x} + I^-(\omega)e^{+\gamma(\omega)x} \qquad (2.1)$$

$$V(x, \omega) = V^+(\omega)e^{-\gamma(\omega)x} + V^-(\omega)e^{+\gamma(\omega)x} = \qquad (2.2)$$
$$= Z_c(\omega)(I^+(\omega)e^{-\gamma(\omega)x} - I^-(\omega)e^{+\gamma(\omega)x})$$

Where $V^+(\omega), V^-(\omega), I^+(\omega)$ and $I^-(\omega)$ are general functions, $\gamma(\omega)=\sqrt{Y(\omega)Z(\omega)}$, and the surge impedance $Z_c(\omega)$ and the surge admittance $Y_c(\omega)$ are defined as:

$$Z_c(\omega)=\sqrt{Z(\omega)/Y(\omega)} \tag{2.3}$$

$$Y_c(\omega)=1/Z_c(\omega)=\sqrt{Y(\omega)/Z(\omega)} \tag{2.4}$$

The complexity of particularly the series impedance $Z(\omega)$ varies with the transmission line configuration, e.g. a cable with numerous conductive layers might include many terms in the calculation of series impedance in order to represent properties such as e.g. sheath surface impedance. The complexity of these expressions may make them difficult to analytically transform into the time domain.

Transmission lines in power systems may comprise several conductors where each conductor in addition to the unit-length series-impedance ($Z(\omega)$) and shunt-admittance to ground ($Y(\omega)$) also will experience a mutual coupling with the other conductors. In the general case with n conductors, the per-unit length series-impedance Z and shunt-admittance Y will therefore be square matrices of dimensions n times n (n×n).

Setting up and solving the telegrapher's equation yields a solution for voltage and current (both are vectors of size n) as shown below in equations (2.5) and (2.6) (see, e.g., H. V. Nguyen et al., "Direct Phase-Domain Modelling of Frequency-Dependent Overhead Transmission Lines", IEEE Trans. Power Del., col. 12, no. 3, pp. 1335-1342, July 1997):

$$I_x = e^{-\Gamma x}I^+ + e^{+\Gamma x}I^- \tag{2.5}$$

$$V_x = Y_c^{-1}e^{-\Gamma x}I^+ - Y_c^{-1}e^{+\Gamma x}I^- = \\ = Y_c^{-1}(e^{-\Gamma x}I^+ - e^{+\Gamma x}I^-) \tag{2.6}$$

where $\Gamma=\sqrt{YZ}$, $I^+$ and $I^-$ are vectors containing forward and backward traveling waves, respectively, and $Y_c$ is the surge admittance matrix:

$$Y_c=\sqrt{(YZ)^{-1}}Y \tag{2.7}$$

Now again consider a single-phase transmission line. Assume that the frequency domain expression of the traveling wave current, $I_{TW}(x,\omega)$, is defined and calculated as shown in equation (3.1):

$$I_{TW}(x,\omega)=I(x,\omega)+Y_c(\omega)V(x,\omega) \tag{3.1}$$

Inserting the equations (2.1) and (2.2) into equation (3.1) results in equation (3.2):

$$I_{TW}(x,\omega)=2I^+(\omega)e^{-\gamma(\omega)x} \tag{3.2}$$

The result in equation (3.2) may be interpreted in the time domain as a scaled forward traveling wave $I^+(\omega)$ (independent of x) which is attenuated, distorted and delayed by a propagation function as it moves down the line in positive x direction.

Figure 2:
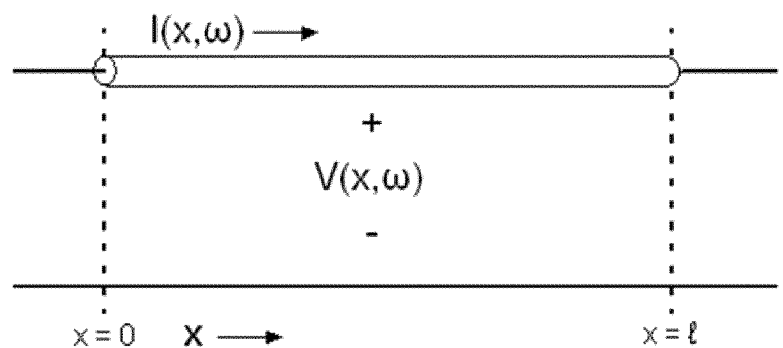
FIG. 2 is a schematic view of a section of single-phase transmission line for illustrating principles and underlying theory of the present invention.

Referring now to FIG. 2, there is shown a single-phase transmission line having a length l for illustrating principles and underlying theory of the present invention. Calculating $I_{TW}(x,\omega)$ at both ends of the transmission line, x=0 and x=l, gives:

$$I_{TW}(0, \omega) = 2I^+(\omega) \tag{3.3}$$

$$I_{TW}(l, \omega) = 2I^+(\omega)e^{-\gamma(\omega)l} = \\ = I_{TW}(0, \omega)e^{-\gamma(\omega)l} = \\ = I_{TW}(0, \omega)H'(\omega)e^{-j\omega\tau} \tag{3.4}$$

where $\tau$ is the travelling time of a wave in the transmission line and $H(\omega)$ is the propagation function:

$$H(\omega)=e^{-\gamma(\omega)l}=H'(\omega)e^{j\omega\tau} \tag{3.5}$$

Since a phase-shift in the frequency domain corresponds to a time-shift in the time domain, the equation (3.4) implies that the calculated $I_{TW}$ in each line end are related by a time-shift and the application of some frequency domain filter $H'(\omega)$.

The travelling wave differential current with respect to one of the line end (e.g., for x=l) can be defined as the difference between the $I_{TW}$ for both of the respective line ends (x=0 and x=l) after the propagation function has been applied to the other line end (e.g., x=0), $I_{TW}(0,\omega)$. This is formalized in equation (3.6) below:

$$I_{TWdiff}(l,\omega)=I_{TW}(0,\omega)H'(\omega)e^{-j\omega\tau}-I_{TW}(l,\omega) \tag{3.6}$$

Transformed into the time domain, the travelling wave differential current $I_{TWdiff}$ with respect to the line end at x=l can then be calculated according to equation (3.7):

$$i_{TWdiff}(l,t)=h'*i_{TW}(0,t-\tau)-i_{TW}(l,t) \tag{3.7}$$

where * denotes the time domain convolution and $i_{TW}(x,t)$ at x=0 and x=l is calculated according to equation (3.8):

$$i_{TW}(x,t)+y_c*u(x,t) \tag{3.8}$$

where $y_c$ is the surge admittance in the time domain.

The result in equation (3.6) is an expression of a differential current that according to equation (3.4) will be zero or substantially zero during all types of external disturbances, e.g. switching transients, external faults, etc. Furthermore, the above equations are independent of the external circuit connected in each line end. However, if a fault is present within the transmission line (between x=0 and l) the equations will no longer be satisfied and the fault current will be represented in $I_{TWdiff}$.

An interpretation of the above principles is that the measured or sensed voltage and current in one line end can be used to construct $I_{TW}$ for one line end, which in turn can be used in estimating $I_{TW}$ for the other line end by applying the propagation function. The estimated $I_{TW}$ can then be compared with the $I_{TW}$ for the same line end that has been constructed using the measured or sensed voltage and current in that line end. If the two differ according to some predefined criteria, an abnormal or unexpected current path may exist in the transmission line, which implies that there is a fault in the transmission line.

Since all calculations above are derived from a certain reference-direction (from left to right in FIG. 2), it is obvious that similar calculations can be made for a wave traveling in the other, negative direction, which would result in similar equations as those above, for protection in both line ends. Discussions herein will mostly refer to a traveling wave differential current with respect to one of the line ends (e.g., for x=l as above), or in other words a single-ended protection. However, double-ended protection can be achieved in a similar way as described herein with reference to a travelling wave differential current with respect to also the other line end (e.g., for x=0), by changing the reference direction.

In case of a lossless transmission line, the surge impedance is constant and no attenuation and/or distortion of the wave occurs, such that H'(ω)=1. In that case, the convolution mentioned above may be replaced with a time-domain multiplication.

Now again consider a transmission line including several conductor, or phases. Similarly as for a single-phase conductor as in FIGS. 1 and 2, assume that the traveling wave current vector, $I_{TWx}$ is defined and calculated at location x as shown in equation (3.9):

$$I_{TWx} = I_x + Y_c V_x \tag{3.9}$$

Inserting equations (2.5) and (2.6) into equation (3.9) yields:

$$I_{TWx} = 2e^{-\Gamma x} I^+ \tag{3.10}$$

Calculating $I_{TWx}$ at both lines of the transmission line, x=0 and x=l gives:

$$I_{TW0} = 2I^+ \tag{3.11}$$

$$\begin{aligned} I_{TWl} &= 2e^{-\Gamma l} I^+ = \\ &= e^{-\Gamma l} I_{TW0} = \\ &= H I_{TW0} \end{aligned} \tag{3.12}$$

where H is the propagation function matrix $$H = e^{-\sqrt{YZ}l} = H' e^{-s\tau min} \tag{3.13}$$

Similarly as for the single-phase conductor as in FIGS. 1 and 2, if the protection is considered to be located at x=l, the phase domain vector of travelling wave differential currents can then be formulated as $$I_{TWdiff} = H I_{TW0} - I_{TWl} \tag{3.14}$$

In a general case, transmission lines consist of several mutually coupled conductors. This implies that calculation of voltage and current in one conductor can not be made without considering the other conductors. One approach to this is to break up the conductors, or phases, into modes.

Each phase that is mutually coupled with another phase or other phases will in the general case introduce a mode (i.e. n conductors—n modes). Once the mode-quantities have been obtained, these can be treated as independent single-phase transmission lines. This implies that each mode in general will have a different surge admittance and propagation function.

An aspect of the modal analysis is the transformation matrix which relates the modal and phase quantities. The process of converting between modal and phase voltage, current, surge admittance, propagation function, etc. can be done for example be done as described in "EMTDC Users Guide V4.2.1", Manitoba HVDC Research Centre Inc., Winnipeg, Manitoba, 2005, pp. 124-127.

As previously mentioned, in an n-conductor configuration, the per-unit length line series impedance (Z) and line shunt admittance (Y) are matrices of dimensions n times n (n x n). The surge admittance matrix is then written as shown in equation (2.7), repeated below for convenience.

$$Y_c = \sqrt{(YZ)^{-1}} Y \tag{5.1}$$

The propagation function matrix (H) can be written in a phase domain matrix-form as shown in equation (3.13) and also repeated below:

$$H = e^{-\sqrt{YZ}l} \tag{5.2}$$

The matrix elements in the surge admittance matrix ($Y_c$) and in the propagation function matrix (H), respectively, can be appoximated using for example a series of rational functions, allowing relatively accurate wideband simulations in the time-domain (see, e.g., H. V. Nguyen et al., "Direct Phase-Domain Modelling of Frequency-Dependent Overhead Transmission Lines", IEEE Trans. Power Del., col. 12, no. 3, pp. 1335-1342, July 1997). However, in alternative or in addition, other ways of approximating the matrix elements in the surge admittance matrix ($Y_c$) and in the propagation function matrix (H), respectively, that can be envisaged by the person skilled in the art can be used.

A general formulation of an N-th order rational approximation of a matrix element is shown below in equation (6.1):

$$f(s) = \sum_{n=1}^{N} \frac{c_n}{s - a_n} + d + sh \tag{6.1}$$

The residues ($c_n$) and poles ($a_n$) are either real or in complex conjugate pairs and d and h are real constants. All of these can be determined using for example a procedure called Vector Fitting as described e.g. in B. Gustavsen and A. Semlyen, "Rational Approximation of Frequency Domain Responses by Vector Fitting", IEEE Trans. Power Del., vol. 14, no. 3, pp. 1052-1061, July 1999.

Using the general formulation of a N-th order rational approximation in equation (6.1), element i,j of the surge admittance matrix can be approximated in the form shown in equation (6.2):

$$Y_{cij}(s) = \sum_{n=1}^{N} \frac{c_{nij}}{s - a_n} + d_{ij} \tag{6.2}$$

All elements of the surge admittance matrix may share the same poles, although this is not necessary.

The constants in equation (6.2) may for example be generated by means of suitable software for modelling and estimating electrical parameters of OHLs and DC cables applied to the particular configuration, e.g. two-conductor OHL or DC cable. For example, the Line Constants Program in PSCAD/EMTDC may be used.

Fitting the elements of H in the phase-domain may be more complicated than fitting the surge admittance. A reason is that $Y_c$ does not contain any phase-shift, or time-delay, as compared to H where each element of the matrix contain modal contributions, each with different time-delays ($\tau_m$). The general phase-domain formulation of approximation of element $H_{ij}$ is shown in equation (6.3) (cf., e.g., B. Gustaysen et al., "Transmission line models for the simulation of interaction phenomena between parallel AC and DC overhead lines", Int. Conf. Power Syst. Transients, Budapest, Hungary, 1999, pp. 61-67):

$$H_{ij}(s) = \sum_{m=1}^{M} \left( \sum_{n=1}^{N_m} \frac{c_{mnij}}{s - a_{mn}} \right) e^{-s\tau_m} \tag{6.3}$$

The constants in equation (6.3) may for example be generated by means of suitable software for modelling and estimating electrical parameters of OHLs and DC cables applied to the particular configuration, e.g. two-conductor OHL or DC cable. For example, the Line Constants Program in PSCAD/EMTDC may be used.

Transformation from frequency domain into time domain implies that the frequency domain multiplication can be performed by the use of convolution integrals in the time domain. Calculating these convolution integrals in the time domain can in the general case be computationally expensive. Algorithms for first order rational functions to calculate such integrals are known, see, e.g., A. Semlyen and A. Dabuleanu, "Fast accurate switching transient calculations on transmission lines with ground return using recursive convolutions", IEEE Trans. Power App. Syst., vol. PAS-94, no. 2, pp. 561-571, March/April 1975, which describes a recursive convolution algorithm.

The two line ends of a transmission line, e.g. an OHL or a DC cable, are typically separated by a distance, thereby implying that some form of communication channel between the two line ends may have to be established in implementing aspects of the present invention. The communication channel may be wired or wireless, e.g. including a wireless communication link for communication of data between the line ends as known in the art. Due to bandwidth limitations, the calculation of $I_{TWx}$ is preferably done in each line end in order to keep the required amount of data to be transmitted to a minimum or below some threshold.

Figure 3:
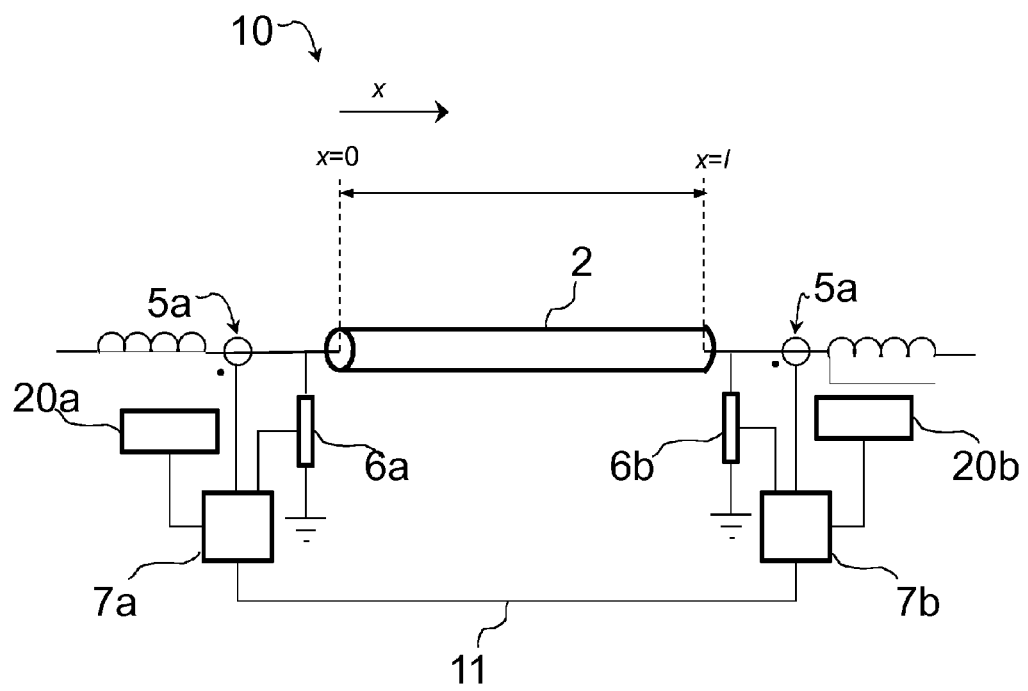
FIG. 3 is a schematic view of a power system according to an embodiment of the present invention.

Referring now to FIG. 3, there is shown a schematic view of a power system 10 according to an embodiment of the present invention. The power system 10 comprises a two-ended transmission line 2 having one line end at x=0 and another line end at x=1 along axis x. The power system 10 comprises two processing units 7a, 7b located at line ends x=0 and x=1, respectively. The processing units 7a, 7b may for example comprise computers or the like. The power system 10 comprises current sensors 5a, 5b and voltage sensors 6a, 6b.

The processing units 7a and 7b are connected by means of a duplex communication channel 11 which may be wired and/or wireless. For effecting a time-shifting of quantitites (as defined in the propagation function H) such as voltages and currents between line ends x=0 and x=1, a clock unit or time measuring unit 20a, 20b, e.g. including a radio clock such as a Global Positioning Satellite (GPS) clock with μs resolution or better, is arranged at each line end x=0 and x=1, allowing for each voltage and current sample, i.e. each measured or sensed voltage or current value, to be time-stamped.

In the following discussions, a single-ended protection of the transmission line 2 is considered, or in other words, that there is one sending end (x=0), where sampling of voltages and currents at position x=0 is carried out and the traveling wave current ($I_{TWx}$) at position x=0 is determined, which subsequently, after the propagation function has been applied to it, is transmitted to a receiving end (x=1), where sampling of voltages and currents at position x=1 and the traveling wave current ($I_{TWx}$) at position x=1 is determined. At the receiving end, the comparison of the estimated and determined traveling wave current ($I_{TWx}$) at x=1, i.e. determination of $I_{TWdiff}$ is carried out This scheme can be mirrored, thereby providing double-ended protection. The calculations can be performed in the modal domain or in the phase domain, as further described in the following.

Figure 4:
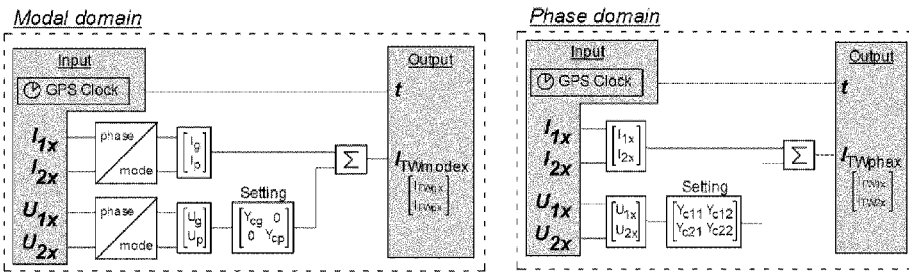
FIG. 4 is a schematic and conceptual illustration of a process in a power system comprising a two-conductor transmission line in accordance with an embodiment of the present invention, which process includes determining the traveling wave current at two line ends.

At each time step, or for each sampling, at both sides of the transmission line 2 voltage and current are measured or sensed, producing a voltage vector and a current vector in either phase domain or modal domain. The voltage vector is applied to the surge admittance matrix, e.g. by means of recursive convolution as described above, and the result is added with the current vector. Note that in the modal domain, the surge admittance matrix is a diagonal matrix. For a symmetrical two-conductor transmission line configuration, this process is schematically shown in FIG. 4 for calculation in both the modal domain and in the phase domain.

Once the traveling wave current ($I_{TWx}$) has been calculated, the propagation function of propagation matrix has to be applied in the sending end (x=0). This calculation can of course be done in an arbitrary line end, but if not every sample is transmitted, the sending end is preferred since a higher resolution may be obtained, useful when the time-shifting is to be applied.

In order to simplify the final time-shift in the receiving end (x=1), some modification of the propagation matrix is convenient to carry out. Since each mode has its respective travelling time, assume that the smallest propagation delay (the mode which has the highest velocity) is identified as $\tau_{min}$ shown below in equation (7.8):

$$\tau_{min} = \min\{\tau_1, \tau_2, \ldots, \tau_M\} \quad (7.8)$$

where M is the number of modes in the system.

Defining each element of the modified propagation function matrix as $H'_{ij}$ which relates to the phase domain fitted propagation matrix-element $H_{ij}$ in equation (6.3) as following:

$$H'_{ij}(s) = H_{ij}(s)e^{+s\tau_{min}} = \quad (7.9)$$
$$= \sum_{m=1}^{M}\left(\sum_{n=1}^{N_m} \frac{c_{mnij}}{s - a_{mn}}\right)e^{-s(\tau_m - \tau_{min})} =$$
$$= \sum_{m=1}^{M}\left(\sum_{n=1}^{N_m} \frac{c_{mnij}}{s - a_{mn}}\right)e^{-s\Delta\tau_m}$$

Similarly, if the propagation matrix instead is fitted in the modal domain:

$$H'^m(s) = H^m(s)e^{+s\tau_{min}} = \quad (7.10)$$
$$= \sum_{n=1}^{N} \frac{c_{nm}}{s - a_{nm}}e^{-s(\tau_m - \tau_{min})} =$$
$$= \sum_{n=1}^{N} \frac{c_{nm}}{s - a_{nm}}e^{-s\Delta\tau_m}$$

The purpose of this time-shifting is to get all calculated quantities ($HI_{TW}$) on the same time base, allowing for simpler processing in the receiving end since only a single time-shift is required when the data package is received. The process of applying the propagation function is conceptually illustrated in FIG. 5. Note that according to this embodiment, this is only done in the sending end (x=0).

Figure 5:
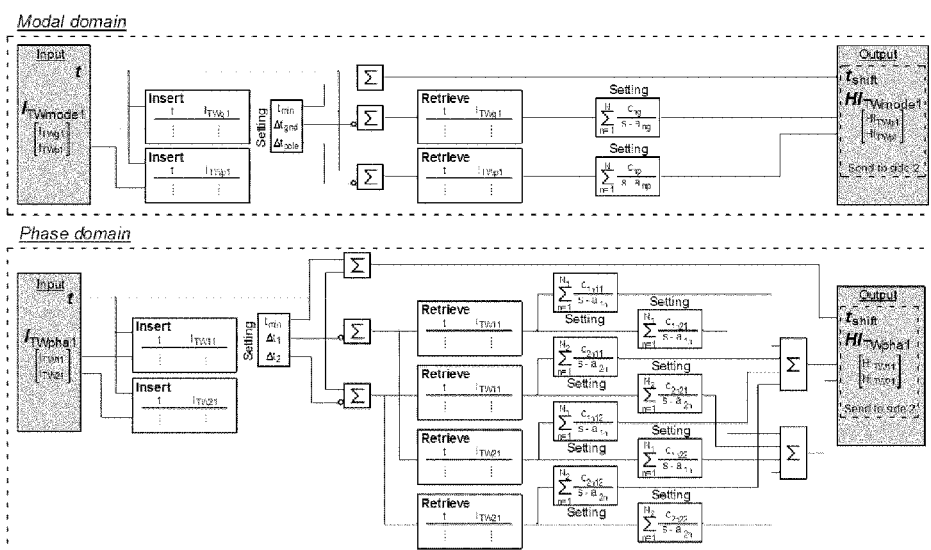
FIG. 5 is a schematic and conceptual illustration of a process in a power system comprising a two-conductor transmission line in accordance with an embodiment of the present invention, which process includes applying the propagation function to one of the determined traveling wave currents.

According to FIG. 5, a list is used to effect the time-shift. The list is continuously loaded with input (cf. left side of FIG. 5), consisting of a time-stamp and the data to be stored (e.g. $I_{TW}$). When the data is to be retrieved from the list, the component is given a time as input and outputs the corresponding data, interpolated between two entries if required. Note that in every execution, Δτ is subtracted from the current time, e.g. as calculated or determined by the clock unit 20a, 20b, thereby achieving the time-shift. Note that for the mode delay which has been chosen as $\tau_{min}$, the $\Delta\tau_m$ will be zero and the table is then assumed to provide the latest input (the value that was inserted earlier during the current execution cycle).

Comparing the phase domain approach and the modal domain approach as shown in FIG. 5, one can conclude that the modal domain approach offers fewer calculation steps compared to the phase domain approach, which is why the modal domain approach may be preferred whenever applicable, in symmetrical systems.

Once the recursive convolution has been applied as illustrated in FIG. 5, the calculated values ($HI_{TW}$) are included with a time-stamp $t_{shift}=t+\tau_{min}$ in a data package which is transmitted over the communication channel to the other side (receiving end, x=1).

Since most of the calculations were applied in the sending end (x=0), when the data package arrives at the receiving end (x=1), the only task thay may remain to be carried out is to compare the received data with the locally calculated $I_{TW}$ (cf. FIG. 4). This comparison performed at the receiving end is schematically shown in FIG. 6.

Figure 6:
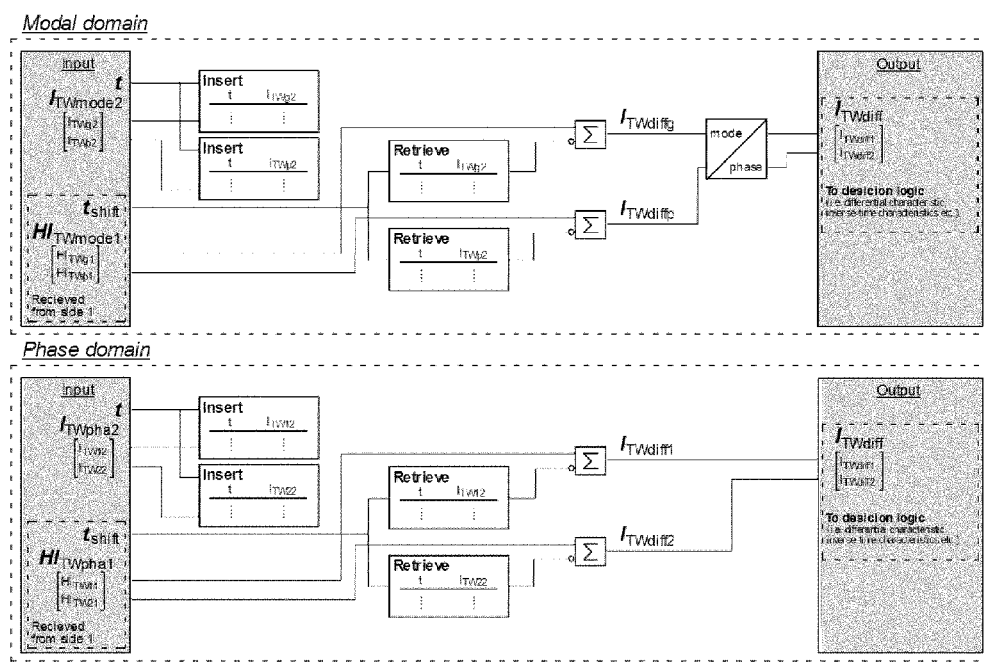
FIG. 6 is a schematic and conceptual illustration of a process in a power system comprising a two-conductor transmission line in accordance with an embodiment of the present invention, which process includes comparing the estimated and determined traveling wave currents in one line end of the transmission line.

As illustrated in FIG. 6, a list is used to store the locally calculated quantities. The reason for this is that the delay in the duplex communication channel between the processing units 7a and 7b may be larger than the propagation delay in the transmission line 2. This implies that the receiving end will have to 'rewind' when a data package is received and therefore retrieve the $I_{TW}$ which was calculated a couple of execution cycles prior to arrival of the transmitted data.

This approach also makes the protection algorithm independent of inconsistent communication delay since the protection in the receiving end always can retrieve an entry from the list. The communication delay will of course affect the speed at which the protection can detect a fault, but the accuracy and/or reliability of the protection or fault sensing algorithm itself is not affected since no false differential current will be created.

In FIG. 6, the last step in the modal domain approach is to transform the modal domain quantities back to the phase domain. This step is optional and may be omitted if the decision logic prefers modal quantities. The modal domain approach and the phase domain approach will provide the same differential currents in a symmetrical system which is why either approach can be used in the examples discussed above with reference to FIGS. 3-6.

Discussions in the foregoing with reference to FIGS. 3-6 have mainly been focused on external disturbances or faults. In the following, internal faults and the properties during internal faults, relevant for the detailed design of the decision logic, will be discussed.

Figure 7:
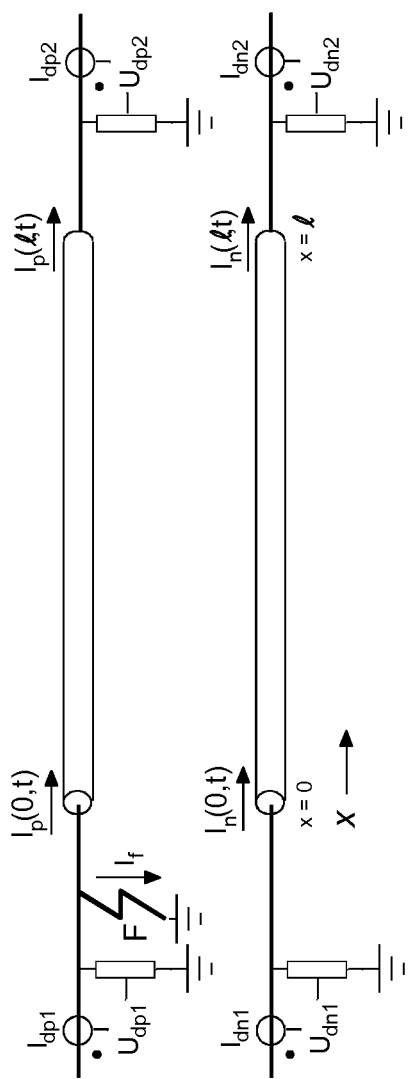
FIG. 7 is a schematic view of a section of a two-conductor transmission line for illustrating principles and underlying theory of the present invention.

Reference is made to FIG. 7. An example of a single-ended protection in a two-ended two-conductor transmission line is considered, where the comparison between differential currents for illustration is made in the receiving end of the transmission line (at x=1), similarly as for the case described above with reference to FIGS. 3-6. Assume an internal fault F which is e.g. located at the sending end of the transmission line, between the left end of the upper transmission line in FIG. 7 and the point where measurements of voltage and current are taken, as shown in FIG. 7.

In FIG. 7, the measurements used for the fault sensing are drawn as voltage dividers and current transformers ($I_{x,measured}$) and the actual transmission line end currents ($I_{x,actual}$) are drawn at each end of the line in FIG. 7. Since the transmission line ends are assumed to be connected close to the voltage measurement sites, the same voltage ($U_x$) is assumed at the actual line end such as used in the fault sensing.

Using the relation of line end quantities given in equation (3.12) to formulate a relation between the actual line end currents and voltages in the phase domain gives equation (7.11):

$$I_{TWl,actual} = HI_{TW0,actual} = \qquad (7.11)$$
$$= H(I_{0,actual} + Y_c U_0)$$

Since in FIG. 7 no fault is present in the receiving end of the transmission line (at x=l), the measured voltage and current will be the same as the actual line end quantities, i.e. $I_{TWl,calculated} = I_{TWl,actual}$.

The differential current that the fault sensing will experience is $$I_{TWdiff} = HI_{TW0,calculated} - I_{TWl,actual} = \qquad (7.12)$$
$$= H(I_{0,measured} + Y_c U_0) - H(I_{0,actual} + Y_c U_0) =$$
$$= H(I_{0,measured} - I_{0,actual}) =$$
$$= HI_f$$

where $I_f$ is a current vector containing the phase domain fault current.

In the case of a positive pole-to-ground fault in the two-conductor case as illustrated in FIG. 7, the experienced phase domain differential current experienced in each phase, or conductor, will be according to equation (7.13):

$$\begin{bmatrix} I_{TWdiff1} \\ I_{TWdiff2} \end{bmatrix} = \begin{bmatrix} H_{11}(s) & H_{12}(s) \\ H_{21}(s) & H_{22}(s) \end{bmatrix} \begin{bmatrix} I_f \\ 0 \end{bmatrix} = \begin{bmatrix} H_{11}(s)I_f \\ H_{21}(s)I_f \end{bmatrix} \qquad (7.13)$$

Equation (7.13) shows that during a remote end pole-to-ground fault, the 'healthy', non-faulted, pole will also experience some differential current, the magnitude depending on the off-diagonal elements of the propagation matrix (which represent the coupling between the conductors). The results in equation (7.13) transformed into modal domain are shown below in equation (7.14):

$$\begin{bmatrix} I_{TWdiffg} \\ I_{TWdiffp} \end{bmatrix} = \frac{1}{2}\begin{bmatrix} 1 & 1 \\ 1 & -1 \end{bmatrix}\begin{bmatrix} H_{11}(s)I_f \\ H_{21}(s)I_f \end{bmatrix} \qquad (7.14)$$
$$= \frac{1}{2}\begin{bmatrix} I_f(H_{11}(s) + H_{21}(s)) \\ I_f(H_{11}(s) - H_{21}(s)) \end{bmatrix}$$
$$= \frac{1}{2}\begin{bmatrix} I_f H_g(s) \\ I_f H_p(s) \end{bmatrix}$$

Also, consider a pole-to-pole fault located in the same position as the fault in FIG. 7 discussed previously (not shown in FIG. 7). The phase domain differential current experienced by the fault sensing can then be written as equation (7.15):

$$\begin{bmatrix} I_{TWdiff1} \\ I_{TWdiff2} \end{bmatrix} = \begin{bmatrix} H_{11}(s) & H_{12}(s) \\ H_{21}(s) & H_{22}(s) \end{bmatrix}\begin{bmatrix} I_f \\ -I_f \end{bmatrix} \qquad (7.15)$$
$$= \begin{bmatrix} (H_{11}(s) - H_{12}(s))I_f \\ (H_{21}(s) - H_{22}(s))I_f \end{bmatrix}$$

Transformation into modal domain gives $$\begin{bmatrix} I_{TWdiffg} \\ I_{TWdiffp} \end{bmatrix} = \frac{1}{2}\begin{bmatrix} 1 & 1 \\ 1 & -1 \end{bmatrix}\begin{bmatrix} I_f(H_{11}(s) - H_{12}(s)) \\ I_f(H_{21}(s) - H_{22}(s)) \end{bmatrix} \quad (7.16)$$

$$= \begin{bmatrix} 0 \\ I_f(H_{11}(s) - H_{12}(s)) \end{bmatrix}$$

$$= \begin{bmatrix} 0 \\ I_f H_p(s) \end{bmatrix}$$

Figure 8:
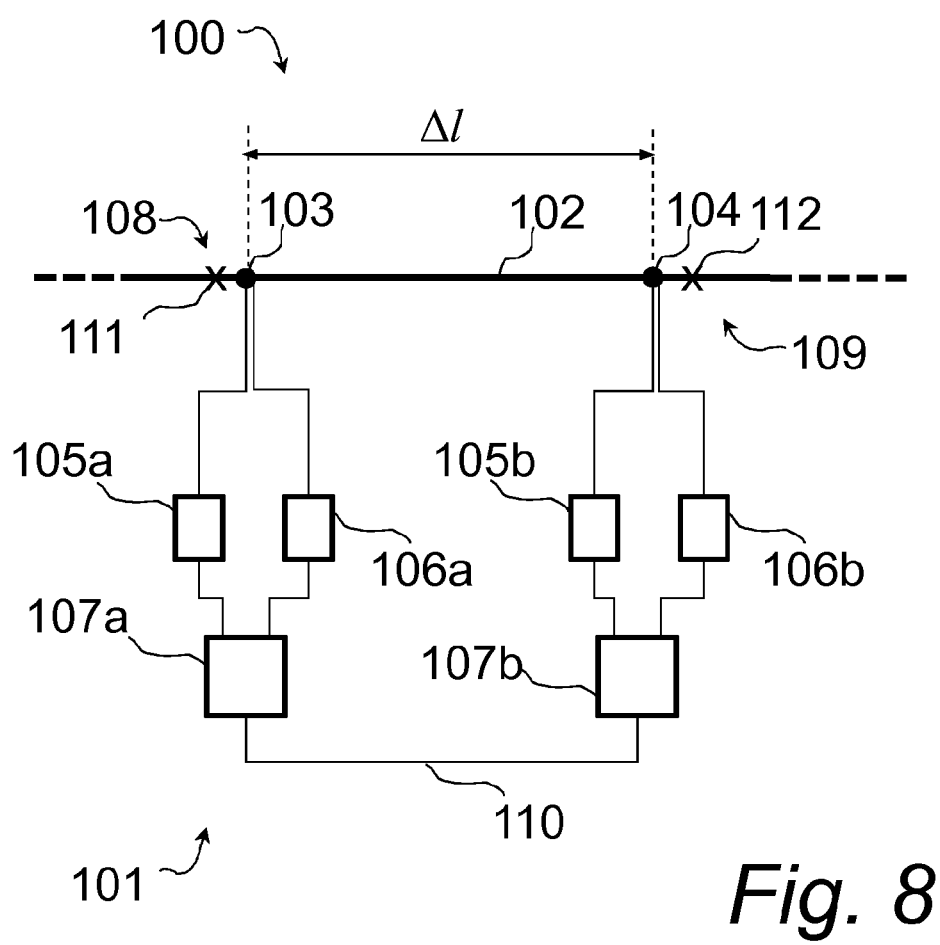
FIG. 8 is a schematic view of a fault sensing system for a power system according to an embodiment of the present invention.

Referring now to FIG. 8, there is shown a schematic view of a fault sensing system 101 for a power system 100 according to an embodiment of the present invention.

The power system 100 includes a protected unit 102, which according to the embodiment depicted in FIG. 8 is constituted by a section of a transmission line, e.g. an OHL or a DC cable, having a length Δl. However, it is to be understood that the protected unit 102 in general may include or be any other part or component of the power system 100, for example a transformer, a generator and/or a transformer station busbar (not shown in FIG. 8).

The fault sensing system 101 is adapted to sense a fault in the protected unit 102.

The protected unit 102 is adapted to convey power from a first position 103 in the protected unit 102 or transmission line 102 to a second position 104, different from the first position 103, in the transmission line 102, or vice versa.

On a condition that a fault occurs in the transmission line 102 there may be generated at least one travelling wave in the transmission line 10.

The fault sensing system 101 comprises two current sensing units 105a, 105b. The current sensing unit 105a is adapted to sense at least one first current in the first position 103, and the current sensing unit 105b is adapted to sense at least one second current in the second position 104.

The fault sensing system 101 comprises two voltage sensing units 106a, 106b. The voltage sensing unit 106a is adapted to sense at least one first voltage in the first position 103, and the voltage sensing unit 106b is adapted to sense at least one second voltage in the second position 104.

The current sensing units 105a, 105b and the voltage sensing units 106a, 106b may include any suitable type or types of current sensors and voltage sensors, respectively, as known in the art, possibly depending on the particular configuration and/or nature of the protected unit 102.

Although FIG. 8 depicts a scenario where the current sensing units 105a, 105b are separate units and the voltage sensing units 106a, 106b are separate voltage sensing units, it is to be understood that the present invention encompasses the case where the current sensing units 105a, 105b are integrally arranged in a single unit and/or the voltage sensing units 106a, 106b are integrally arranged in a single unit.

The current sensing unit 105a and the voltage sensing unit 106a, and the current sensing unit 105b and the voltage sensing unit 106b, respectively, may be integrally arranged in single units.

According to the embodiment depicted in FIG. 8, the fault sensing system 101 comprises a first and a second processing unit 107a, 107b. However, the present invention encompasses the case where the fault sensing system 101 comprises one processing unit, configured so as to include the functionality of the two processing units 107a, 107b as described in the following.

The first processing unit 107a is adapted to determine at least one first travelling wave current in the first position 103 based on the at least one first current and the at least one first voltage sensed in the first position 103 by the current sensing unit 105a and the voltage sensing unit 106a, respectively.

The second processing unit 107b is adapted to determine at least one second travelling wave current in the second position 104 based on the at least one second current and the at least one second voltage sensed in the second position 104 by the current sensing unit 105b and the voltage sensing unit 106b, respectively.

One or both of the first and second processing units 107a, 107b is adapted to model any distortion, attenuation and/or delay of the waveform of a wave due to propagation of the wave in the transmission line 102 by means of a propagation function.

At least one of the at least one first travelling wave current and the at least one second travelling wave current is estimated by applying the propagation function to the at least one second travelling wave current or to the at least one first travelling wave current, respectively.

According to a first embodiment of the present invention, the first processing unit 107a is adapted to model any distortion, attenuation and/or delay of the waveform of a wave due to propagation of the wave in the transmission line 102 by means of a propagation function. The at least one second travelling wave current, determined at the second processing unit 107b, is estimated by the first processing unit 107a by applying the propagation function to the at least one first travelling wave current determined at the first processing unit 107a. The first processing unit 107a then compares the estimated at least one first travelling wave current with the determined at least one first travelling wave current, and based on the comparison, the first processing unit 107a determines whether there is a fault in the transmission line 102. According to a second embodiment of the present invention, the second processing unit 107b is adapted to model any distortion, attenuation and/or delay of the wave-form of a wave due to propagation of the wave in the transmission line 102 by means of a propagation function. The at least one first travelling wave current, determined at the first processing unit 107a, is estimated by the second processing unit 107b by applying the propagation function to the at least one second travelling wave current determined at the second processing unit 107b. The second processing unit 107b thereafter compares the estimated at least one second travelling wave current with the determined at least one second travelling wave current, and based on the comparison, the second processing unit 107b determines whether there is a fault in the transmission line 102.

The first and second embodiments of the present invention described in the foregoing may be combined such that both of the first and second processing units 107a, 107b determines whether there is a fault in the transmission line 102.

In FIG. 8, the connecting lines between elements 107a and 105a and 106a, respectively, and between 107b and 105b and 106b, respectively, implies two-way communication between the respective elements or one-way communication between elements 105a and 106a, respectively, to element 107a, and between elements 105b and 106b, respectively, to element 107b.

Since Δl may be relatively large, e.g. hundreds of kilometers or more in case the protected unit 102 is a transmission line, the connection 110 between the first and second processing units 107a, 107b may comprise a wireless link or communication path, although a wired connection, possibly combined with a wireless communication link, may also be contemplated. The wireless link or communication path may include any suitable wireless link(s) or communication path(s) as known in the art for effecting wireless communication of data or wireless signaling between first and second processing units 107a, 107b.

On a condition that there is determined that there is a fault in the transmission line 102 or protected unit 102, the protected unit 102 may be isolated from at least a portion of the rest of the power system 100. To this end, the power system 100 comprises a circuit breaker 111 arranged at a first end 108 of the protected unit 102, and a circuit breaker 112 arranged at a second end 109 of the protected unit 109. As illustrated in FIG. 8, the first position 103 is arranged at the first end 108, and the second position 104 is arranged at the second end 109. Isolating the protected unit 102 from at least a portion of the rest of the power system 100 may be effected by opening the circuit breakers 111 and 112. The operation of the circuit breakers 111, 112 may for example be controlled by the first and/or the second processing unit 107a, 107b, or by any other controller (not shown in FIG. 8) included in the fault sensing system 101 or the power system 100.

Figure 9:
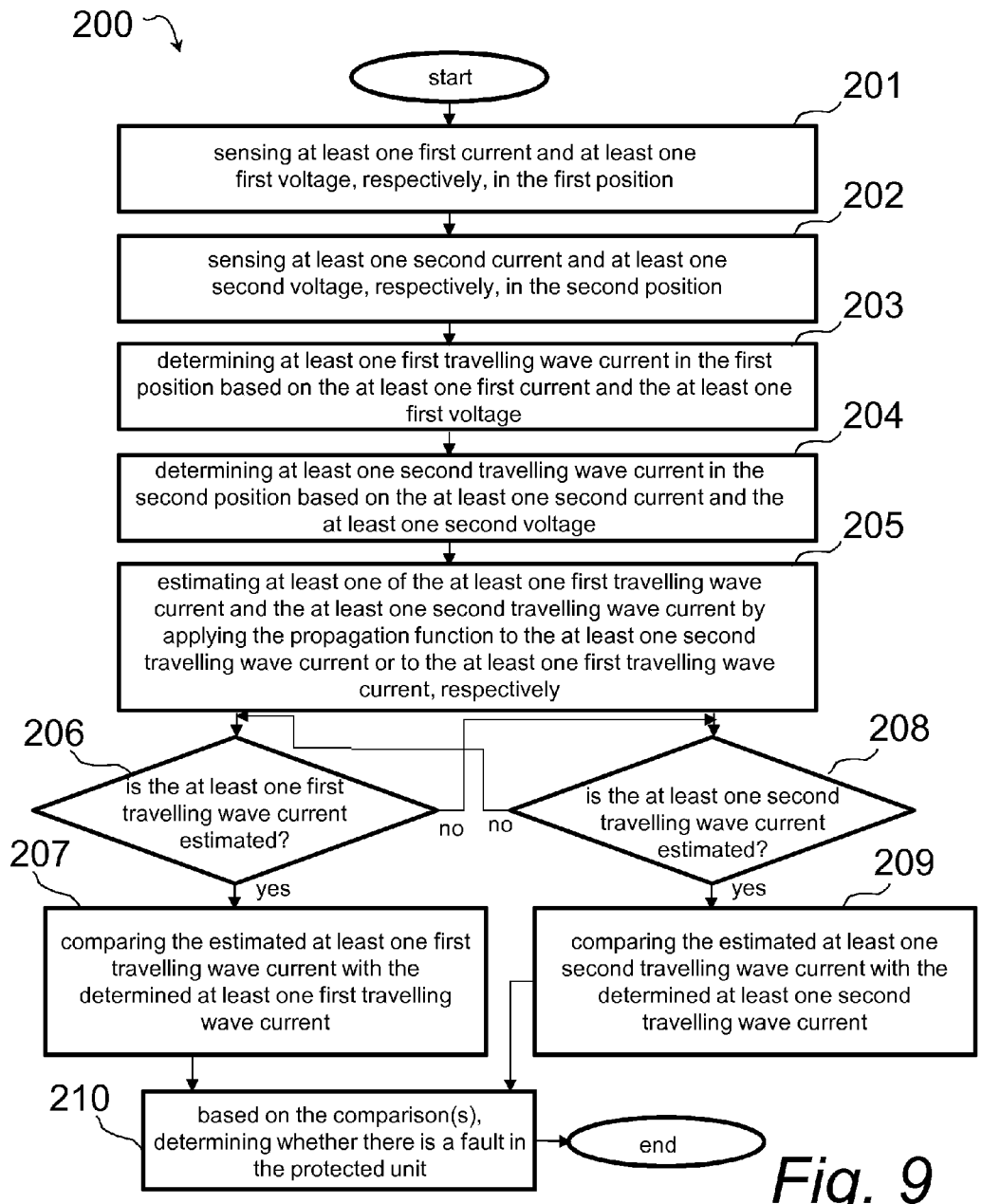
FIG. 9 is a schematic flowchart of a method for sensing a fault in a protected unit included in a power system according to an embodiment of the present invention.

Referring now to FIG. 9, there is shown a schematic flowchart of a method 200 for sensing a fault in a protected unit included in a power system according to an embodiment of the present invention. The protected unit is adapted to convey power from a first position in the protected unit to a second position, different from the first position, in the protected unit, or vice versa. On a condition that a fault occurs in the protected unit at least one travelling wave is generated in the protected unit, wherein any distortion, attenuation and/or delay of the waveform of a wave due to propagation of the wave in the protected unit can be modeled by means of a propagation function.

The method 200 comprises sensing at least one first current and at least one first voltage, respectively, in the first position, 201.

At least one second current and at least one second voltage, respectively, in the second position, are sensed, 202.

At least one first travelling wave current in the first position is determined based on the at least one first current and the at least one first voltage, 203.

At least one second travelling wave current in the second position is determined based on the at least one second current and the at least one second voltage, 204.

The determination of the at least one first travelling wave current and/or the at least one second travelling wave current may be based on an estimated surge admittance of the protected unit.

At least one of the at least one first travelling wave current and the at least one second travelling wave current is estimated by applying the propagation function to the at least one second travelling wave current or to the at least one first travelling wave current, respectively, 205.

At step 206, there is checked whether the at least one first travelling wave current has been estimated. If so, the estimated at least one first travelling wave current is compared with the determined at least one first travelling wave current, 207. If not, the method 200 proceeds to step 208.

At step 208, there is checked whether the at least one second travelling wave current has been estimated. If so, the estimated at least one second travelling wave current is compared with the determined at least one second travelling wave current, 209. If not, the method 200 proceeds to step 206.

Since at least one of the at least one first travelling wave current and the at least one second travelling wave current was estimated in step 205, the method eventually proceeds to step 210, where, based on the comparison or comparisons, there is determined whether there is a fault in the protected unit.

In conclusion, there is disclosed a fault sensing system for a power system including a protected unit. The fault sensing system is adapted to sense a fault in the protected unit. The fault sensing system comprises at least one current sensing unit adapted to sense at least one first current in a first position in the protected unit and at least one second current in the second position in the protected unit, and at least one voltage sensing unit adapted to sense at least one first voltage in the first position and at least one second voltage in the second position, and at least one processing unit. The at least one processing unit is adapted to model any distortion, attenuation and/or delay of the waveform of a wave due to propagation of the wave in the protected unit by means of a propagation function, determine at least one first travelling wave current in the first position based on the at least one first current and the at least one first voltage, determine at least one second travelling wave current in the second position based on the at least one second current and the at least one second voltage, estimate at least one of the at least one first travelling wave current and the at least one second travelling wave current by applying the propagation function to the at least one second travelling wave current or to the at least one first travelling wave current, respectively, on a condition that the at least one first travelling wave current is estimated, compare the estimated at least one first travelling wave current with the determined at least one first travelling wave current, on a condition that the at least one second travelling wave current is estimated, compare the estimated at least one second travelling wave current with the determined at least one second travelling wave current, and, based on the comparison or comparisons, determine whether there is a fault in the protected unit.

While the present invention has been illustrated and described in detail in the appended drawings and the foregoing description, such illustration and description are to be considered illustrative or exemplifying and not restrictive; the present invention is not limited to the disclosed embodiments. Other variations to the disclosed embodiments can be understood and effected by those skilled in the art in practicing the claimed invention, from a study of the drawings, the disclosure, and the appended claims. The mere fact that certain measures are recited in mutually different dependent claims does not indicate that a combination of these measures cannot be used to advantage.

The invention claimed is:

1. A method for sensing a fault in a protected unit included in a power system the protected unit being adapted to convey power from a first position in the protected unit to a second position, different from the first position, in the protected unit, or vice versa, wherein on a condition that a fault occurs in the protected unit at least one travelling wave is generated in the protected unit, wherein any distortion, attenuation and/or delay of the waveform of a wave due to propagation of the wave in the protected unit can be modeled by means of a propagation function, the method comprising:

sensing at least one first current and at least one first voltage, respectively, in the first position;

sensing at least one second current and at least one second voltage, respectively, in the second position;

determining at least one first travelling wave current in the first position based on the at least one first current and the at least one first voltage;

determining at least one second travelling wave current in the second position based on the at least one second current and the at least one second voltage;

estimating at least one of the at least one first travelling wave current and the at least one second travelling wave current by applying the propagation function to the at least one second travelling wave current or to the at least one first travelling wave current, respectively;

on a condition that the at least one first travelling wave current is estimated, comparing the estimated at least one first travelling wave current with the determined at least one first travelling wave current;

on a condition that the at least one second travelling wave current is estimated, comparing the estimated at least one second travelling wave current with the determined at least one second travelling wave current; and based on the comparison or comparisons, determining whether there is a fault in the protected unit, the method further comprising:

on a condition that the at least one first travelling wave current is estimated:

for each of the at least one first current and the at least one first voltage, determining a time when the respective current or voltage was sensed; and determining time information associated with the at least one first travelling wave current based on the time when the at least one first current and/or the at least one first voltage was sensed;

on a condition that the at least one second travelling wave current is estimated:

for each of the at least one second current and the at least one second voltage, determining a time when the respective current or voltage was sensed;

determining time information associated with the at least one second travelling wave current based on the time when the at least one second current and/or the at least one second voltage was sensed, determining a time-shift function based on at least the determined time information and a propagation time period of a wave travelling from the first position to the second position, or vice versa; and prior to estimating at least one of the at least one first travelling wave current and the at least one second travelling wave current, applying the time-shift function to the propagation function so as to modify the propagation function, which subsequently is used in estimating at least one of the at least one first travelling wave current and the at least one second travelling wave current.

2. The method according to claim 1, wherein the determination of the at least one first travelling wave current and/or the at least one second travelling wave current is based further on an estimated surge admittance of the protected unit.

3. The method according to claim 2, wherein the protected unit is adapted to convey power from a first position in the protected unit to a second position in the protected unit, or vice versa, along at least one current path between the first position and the second position, wherein:

the surge admittance is estimated based on at least one of the line series impedance per unit length of the at least one current path and the line shunt admittance per unit length of the at least one current path; and/or the propagation function is based on at least one of the line series impedance per unit length of the at least one current path, the line shunt admittance per unit length of the at least one current path and a length of the at least one current path.

4. The method according to claim 2, wherein:

comparing the estimated at least one first travelling wave current with the determined at least one first travelling wave current comprises determining a difference between the estimated at least one first travelling wave current and the determined at least one first travelling wave current;

comparing the estimated at least one second travelling wave current with the determined at least one second travelling wave current comprises determining a difference between the estimated at least one second travelling wave current and the determined at least one second travelling wave current; and determining whether there is a fault in the protected unit comprises:

determining a fault detection characteristic based on the difference;

comparing the fault detection with a selected fault detection criteria;

on a condition that the fault detection characteristic complies with the selected fault detection criteria, determining that there is a fault in the protected unit; and on a condition that the fault detection characteristic does not comply with the selected fault detection criteria, determining that there is no fault in the protected unit.

5. A method for protecting a protected unit included in a power system, the protected unit being adapted to convey power from a first position in the protected unit to a second position, different from the first position, in the protected unit, or vice versa, the method comprising:

sensing a fault in the protected unit by performing a method according to claim 2;

on a condition that there is determined that there is a fault in the protected unit, isolating the protected unit from at least a portion of the rest of the power system.

6. The method according to claim 1, wherein the protected unit is adapted to convey power from a first position in the protected unit to a second position in the protected unit, or vice versa, along at least one current path between the first position and the second position, wherein:

the surge admittance is estimated based on at least one of the line series impedance per unit length of the at least one current path and the line shunt admittance per unit length of the at least one current path; and/or the propagation function is based on at least one of the line series impedance per unit length of the at least one current path, the line shunt admittance per unit length of the at least one current path and a length of the at least one current path.

7. The method according to claim 6, wherein:

comparing the estimated at least one first travelling wave current with the determined at least one first travelling wave current comprises determining a difference between the estimated at least one first travelling wave current and the determined at least one first travelling wave current;

comparing the estimated at least one second travelling wave current with the determined at least one second travelling wave current comprises determining a difference between the estimated at least one second travelling wave current and the determined at least one second travelling wave current; and determining whether there is a fault in the protected unit comprises:

determining a fault detection characteristic based on the difference;

comparing the fault detection with a selected fault detection criteria;

on a condition that the fault detection characteristic complies with the selected fault detection criteria, determining that there is a fault in the protected unit; and on a condition that the fault detection characteristic does not comply with the selected fault detection criteria, determining that there is no fault in the protected unit.

8. A method for protecting a protected unit included in a power system,
the protected unit being adapted to convey power from a first position in the protected unit to a second position, different from the first position, in the protected unit, or vice versa, the method comprising:
  sensing a fault in the protected unit by performing a method according to claim 6;
  on a condition that there is determined that there is a fault in the protected unit, isolating the protected unit from at least a portion of the rest of the power system.

9. The method according to claim 1, wherein:
  comparing the estimated at least one first travelling wave current with the determined at least one first travelling wave current comprises determining a difference between the estimated at least one first travelling wave current and the determined at least one first travelling wave current;
  comparing the estimated at least one second travelling wave current with the determined at least one second travelling wave current comprises determining a difference between the estimated at least one second travelling wave current and the determined at least one second travelling wave current; and
  determining whether there is a fault in the protected unit comprises:
    determining a fault detection characteristic based on the difference;
    comparing the fault detection with a selected fault detection criteria;
    on a condition that the fault detection characteristic complies with the selected fault detection criteria, determining that there is a fault in the protected unit; and
    on a condition that the fault detection characteristic does not comply with the selected fault detection criteria, determining that there is no fault in the protected unit.

10. A method for protecting a protected unit included in a power system,
the protected unit being adapted to convey power from a first position in the protected unit to a second position, different from the first position, in the protected unit, or vice versa, the method comprising:
  sensing a fault in the protected unit by performing a method according to claim 9;
  on a condition that there is determined that there is a fault in the protected unit, isolating the protected unit from at least a portion of the rest of the power system.

11. A method for protecting a protected unit included in a power system,
the protected unit being adapted to convey power from a first position in the protected unit to a second position, different from the first position, in the protected unit, or vice versa, the method comprising:
  sensing a fault in the protected unit by performing a method according to claim 1;
  on a condition that there is determined that there is a fault in the protected unit, isolating the protected unit from at least a portion of the rest of the power system.

12. The method according to claim 11, wherein the power system comprises at least one circuit breaker arranged at a first end of the protected unit and at least one circuit breaker arranged at a second end of the protected unit, wherein the first position is arranged at the first end and the second position is arranged at the second end, and wherein isolating the protected unit from at least a portion of the rest of the power system comprises opening the at least one circuit breaker at the first and second ends, respectively.

13. A fault sensing system for a power system including a protected unit, the fault sensing system being adapted to sense a fault in the protected unit, wherein the protected unit is adapted to convey power from a first position in the protected unit to a second position, different from the first position, in the protected unit, or vice versa, wherein on a condition that a fault occurs in the protected unit at least one travelling wave is generated in the protected unit, the fault sensing system comprising:
  at least one current sensing adapted to sense at least one first current in the first position and at least one second current in the second position;
  at least one voltage sensing unit adapted to sense at least one first voltage in the first position and at least one second voltage in the second position; and
  at least one processing unit adapted to:
  determine at least one first travelling wave current in the first position based on the at least one first current and the at least one first voltage;
  determine at least one second travelling wave current in the second position based on the at least one second current and the at least one second voltage;
  model any distortion, attenuation and/or delay of the waveform of a wave due to propagation of the wave in the protected unit by means of a propagation function;
  estimate at least one of the at least one first travelling wave current and the at least one second travelling wave current by applying the propagation function to the at least one second travelling wave current or to the at least one first travelling wave current, respectively;
  on a condition that the at least one first travelling wave current is estimated, compare the estimated at least one first travelling wave current with the determined at least one first travelling wave current;
  on a condition that the at least one second travelling wave current is estimated, compare the estimated at least one second travelling wave current with the determined at least one second travelling wave current; and
  based on the comparison or comparisons, determine whether there is a fault in the protected unit;
the at least one processing unit being further adapted to
  on a condition that the at least one first travelling wave current is estimated:
    for each of the at least one first current and the at least one first voltage, determine a time when the respective current or voltage was sensed; and
    determine time information associated with the at least one first travelling wave current based on the time when the at least one first current and/or the at least one first voltage was sensed;
  on a condition that the at least one second travelling wave current is estimated:
    for each of the at least one second current and the at least one second voltage, determine a time when the respective current or voltage was sensed;
    determine time information associated with the at least one second travelling wave current based on the time when the at least one second current and/or the at least one second voltage was sensed;
    determine a time-shift function based on at least the determined time information and a propagation time period of a wave travelling from the first position to the second position, or vice versa; and prior to estimating at least one of the at least one first travelling wave current and the at least one second travelling wave current, apply the time-shift function to the propagation function so as to modify the propagation function, which subsequently is used in estimating at least one of the at least one first travelling wave current and the at least one second travelling wave current.

14. A power system including a protected unit adapted to convey power from a first position in the protected unit to a second position, different from the first position, in the protected unit, or vice versa, and a fault sensing system according to claim 13 for sensing whether there is a fault in the protected unit.

15. The power system according to claim 14, wherein the protected unit comprises a direct current, DC, transmission line.

16. A power system according to claim 15, wherein the power system comprises a High Voltage Direct Current, HVDC, power transmission system.

17. The power system according to claim 14, wherein the power system comprises a High Voltage Direct Current, HVDC, power transmission system.

18. A computer program product adapted to be executed in a processing unit of a fault sensing system in a power system, the computer program product comprising non-transitory computer-readable means carrying computer program code, the power system comprising a protected unit, wherein the fault sensing system is adapted to sense a fault in the protected unit, and wherein the protected unit is adapted to convey power from a first position in the protected unit to a second position, different from the first position, in the protected unit, or vice versa, the fault sensing system further comprising at least one current sensing unit and at least one voltage sensing unit, wherein on a condition that a fault occurs in the protected unit at least one travelling wave is generated in the protected unit, wherein the processing unit is adapted to model any distortion, attenuation and/or delay of the waveform of a wave due to propagation of the wave in the protected unit by means of a propagation function;

the computer program code being configured to, when executed in the processing unit of the fault sensing system, cause the at least one current sensing unit to sense at least one first current in the first position and at least one second current in the second position, and cause the at least one voltage sensing unit to sense at least one first voltage in the first position and at least one second voltage in the second position;

the computer program code being further configured to, when executed in the processing unit of the fault sensing system:

determine at least one first travelling wave current in the first position based on the at least one first current and the at least one first voltage;

determine at least one second travelling wave current in the second position based on the at least one second current and the at least one second voltage;

estimate at least one of the at least one first travelling wave current and the at least one second travelling wave current by applying the propagation function to the at least one second travelling wave current or to the at least one first travelling wave current, respectively;

on a condition that the at least one first travelling wave current is estimated, compare the estimated at least one first travelling wave current with the determined at least one first travelling wave current;

on a condition that the at least one second travelling wave current is estimated, compare the estimated at least one second travelling wave current with the determined at least one second travelling wave current; and based on the comparison or comparisons, determine whether there is a fault in the protected unit, the computer program code being further configured to on a condition that the at least one first travelling wave current is estimated:

for each of the at least one first current and the at least one first voltage, determine a time when the respective current or voltage was sensed; and determine time information associated with the at least one first travelling wave current based on the time when the at least one first current and/or the at least one first voltage was sensed;

on a condition that the at least one second travelling wave current is estimated:

for each of the at least one second current and the at least one second voltage, determine a time when the respective current or voltage was sensed;

determine time information associated with the at least one second travelling wave current based on the time when the at least one second current and/or the at least one second voltage was sensed, determine a time-shift function based on at least the determined time information and a propagation time period of a wave travelling from the first position to the second position, or vice versa; and prior to estimating at least one of the at least one first travelling wave current and the at least one second travelling wave current, apply the time-shift function to the propagation function so as to modify the propagation function, which subsequently is used in estimating at least one of the at least one first travelling wave current and the at least one second travelling wave current.

* * * * *